United States Patent [19]

Rubinson

[11] Patent Number: 5,432,450
[45] Date of Patent: Jul. 11, 1995

[54] TRUNCATED NUCLEAR MAGNETIC IMAGING PROBE

[75] Inventor: Kenneth A. Rubinson, Cincinnati, Ohio

[73] Assignee: The Five Oaks Research Institute, Cincinnati, Ohio

[21] Appl. No.: 198,156

[22] Filed: Feb. 17, 1994

Related U.S. Application Data

[63] Continuation-in-part of Ser. No. 28,386, Mar. 9, 1993, Pat. No. 5,347,221.

[51] Int. Cl.$^6$ ................................................ G01V 3/00
[52] U.S. Cl. .................................. 324/318; 128/653.5
[58] Field of Search ............... 324/318, 300, 307, 309, 324/314, 322; 128/653.5

[56] References Cited

U.S. PATENT DOCUMENTS

| | | | |
|---|---|---|---|
| 4,724,389 | 2/1988 | Hyde et al. | 324/318 |
| 4,725,779 | 2/1988 | Hyde et al. | 324/318 |
| 4,746,866 | 5/1988 | Roschmann | 324/318 |
| 4,839,594 | 6/1989 | Misic et al. | 324/318 |
| 4,841,248 | 6/1989 | Mehdizadeh et al. | 324/318 |
| 4,939,465 | 7/1990 | Biehl et al. | 324/318 |
| 5,050,607 | 9/1991 | Bradley et al. | 128/653.5 |
| 5,170,789 | 12/1992 | Narayan et al. | 128/653.5 |
| 5,184,076 | 2/1993 | Ehnholm | 324/318 |
| 5,347,221 | 9/1994 | Rubison | 324/318 |

FOREIGN PATENT DOCUMENTS 0084946 1/1983 European Pat. Off. .

OTHER PUBLICATIONS

"Novel High-Frequency Resonator For NMR Imaging and Spectroscopy" (Journal of Magnetic Resonance 89, 331-342) (1990).

"Broadband (up to 10GHz) Electron-Paramagnetic-Resonance Spectrometer: CW Implementation With Direct Detection" (Rev. Sci. Instrum. 60 (30), Mar. 1989.

"Surface Coil For MR Imaging Of The Skin" (Magnetic Resonance In Medicine 5, 456-461) (1987).

"Intravascular (Catheter) NMR Receiver Probe: Preliminary Design Analysis And Application To Canine Iliofemoral Imaging" (Magnetic Resonance In Medicine 24, 343-357 (1992).

"Dedicated Coils In Magnetic Resonance Imaging", Sobol, W. T., Revs. Magn. Reson. Med., 1987.

*Primary Examiner*—Louis Arana
*Attorney, Agent, or Firm*—Morris, Manning & Martin

[57] ABSTRACT

A planar, truncated imaging probe having a large surface area for medical imaging is disclosed. The planar imaging probe includes first and second conductive members that are adapted at their respective first ends to couple to a radio frequency source. The second ends of the first and second conductive members are electrically short-circuited together to form an electrical circuit. The second conductive member has a length and width that is greater than the length and width of the first conductive member so a side of the first conductive member is covered by the second conductive member. The first conductive member is preferably composed of two slanting surfaces that join at an apex while the second conductive member includes a planar member and upwardly sloping sides to further shield the first conductive member. The first and second conductive members may be separated by electrical isolation standoffs to improve the rigidity of the first conductive member for supporting the sample to be imaged. The planar, truncated imaging probe of the present invention may be directly coupled or inductively coupled to the radio frequency source.

12 Claims, 4 Drawing Sheets

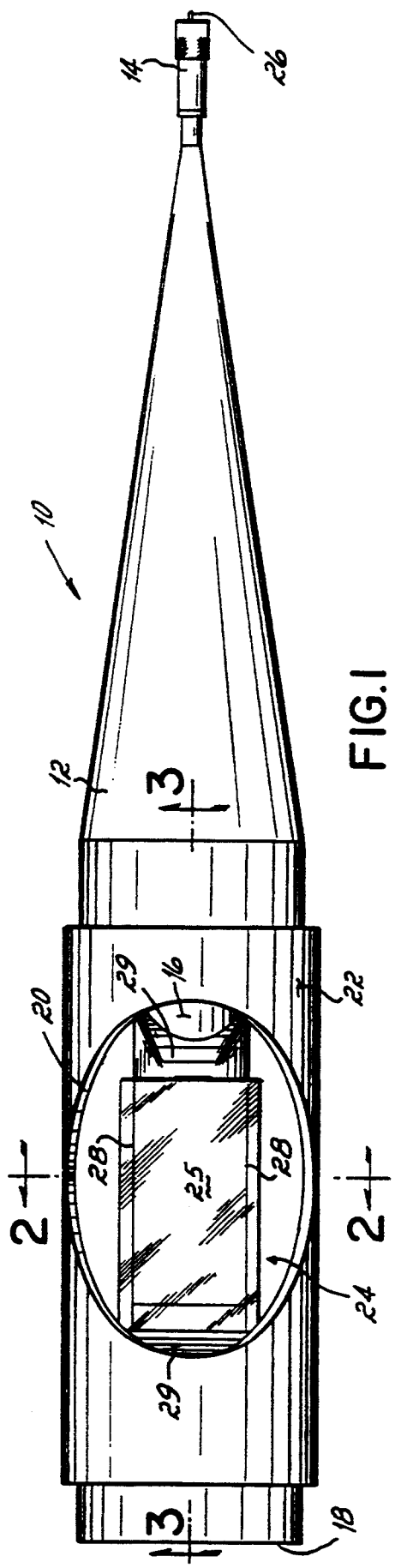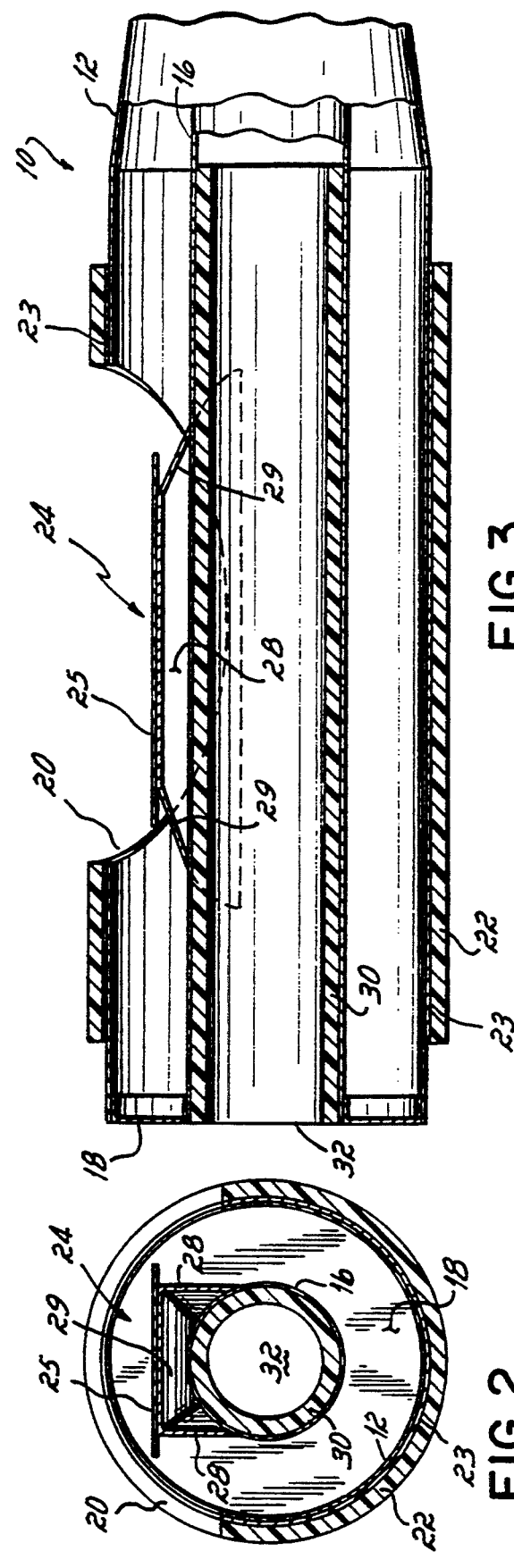

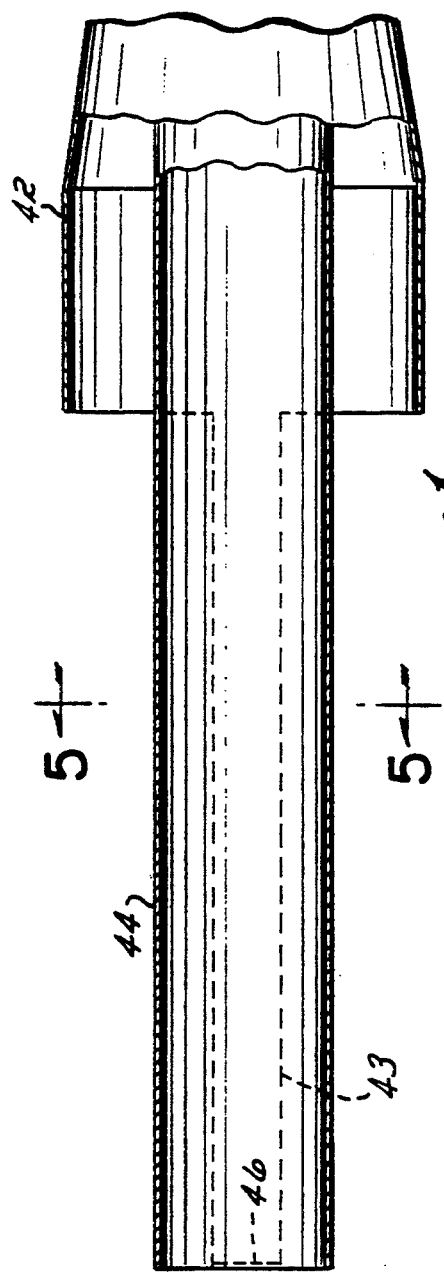
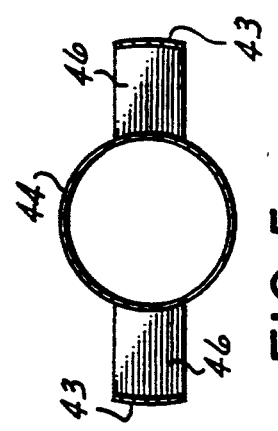
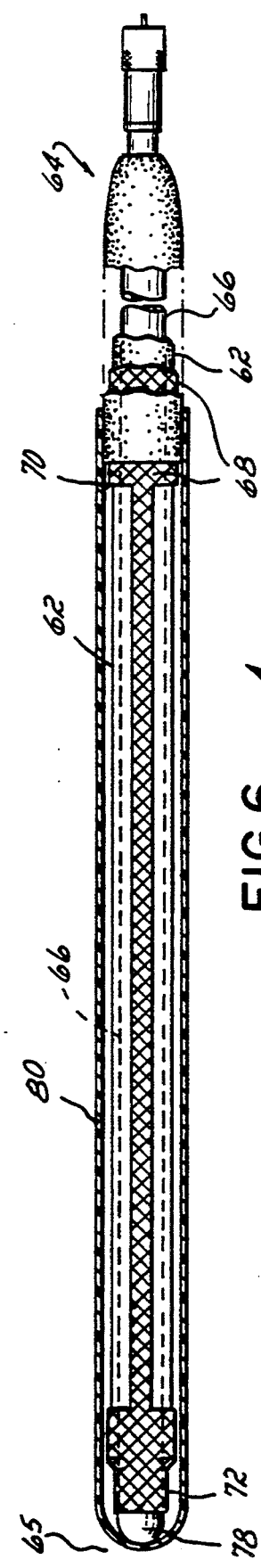
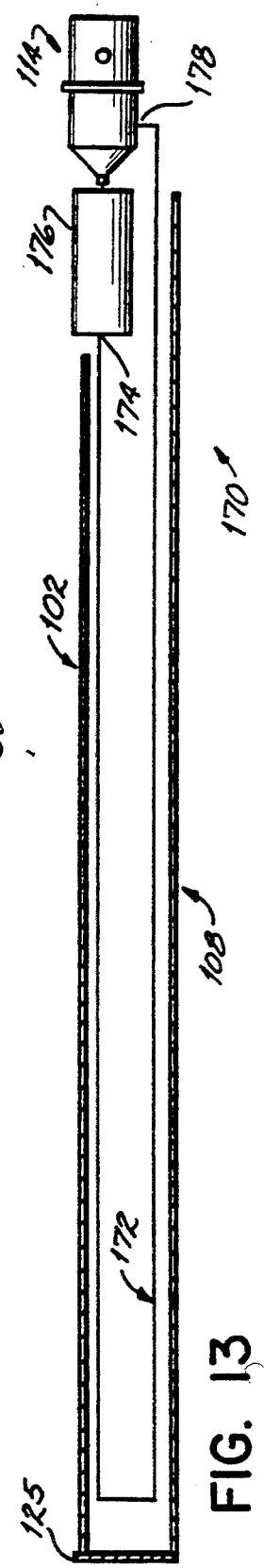

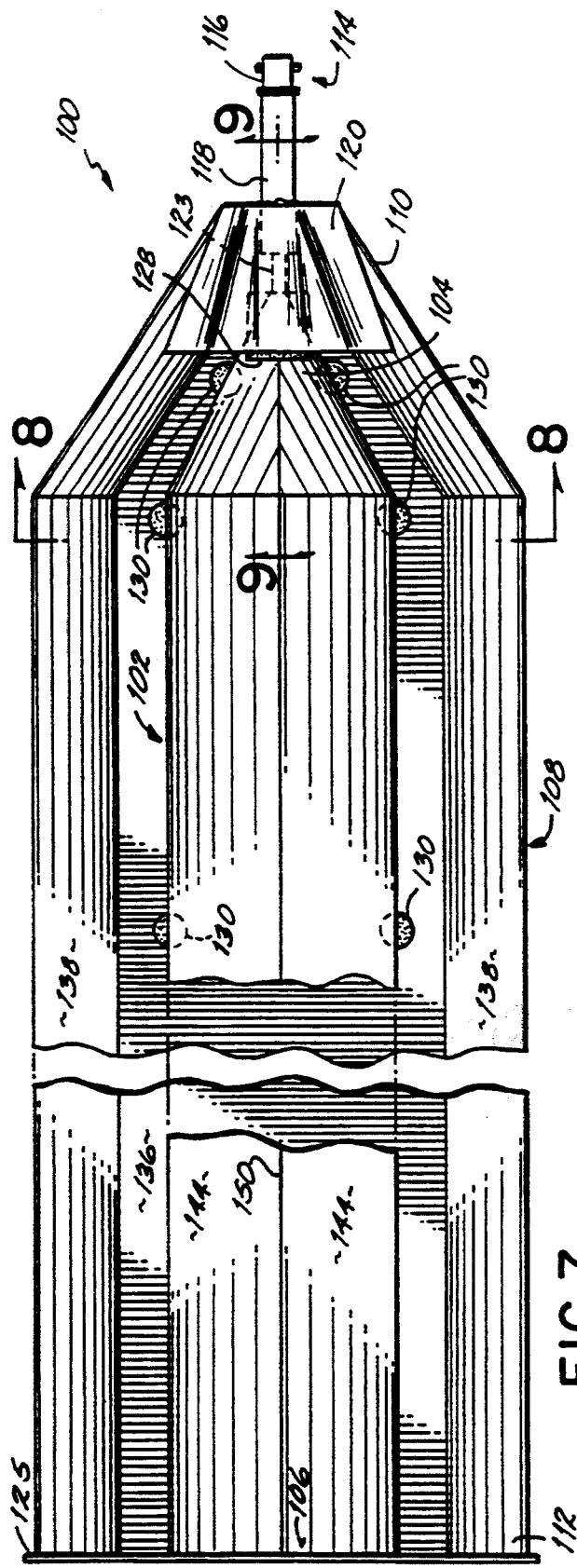
FIG.7
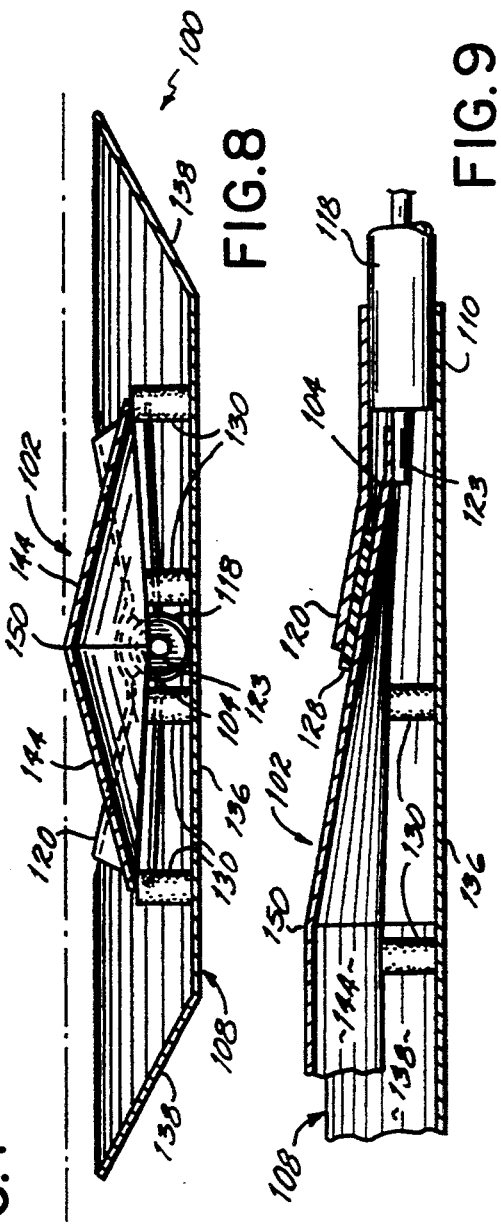
FIG.8
FIG.9

TRUNCATED NUCLEAR MAGNETIC IMAGING PROBE

This is a continuation-in-part of U.S. Ser. No. 08/028,386 filed Mar. 9, 1993, now U.S. Pat. No. 5,347,221. This device is related to imaging probes and more particularly, to Nuclear Magnetic and Electron Paramagnetic Resonance imaging probes.

FIELD OF THE INVENTION

Background of the Invention

Imaging techniques that use the magnetic field response of an atom's nuclear spin or of its unpaired electron spin are known. These images depend on the responses generated by a sample placed within or contiguous to a probe both of which are located in a strong, static magnetic field. A number of electrical conductors comprise part of the probe and these conductors are typically arranged in a "birdcage" manner. A radio frequency signal is pulsed through the electrical conductors to generate a corresponding magnetic field that excites the nuclear spins of a group of protons that are aligned with the static field. As the group of excited protons return to the state in which they were prior to being excited by the magnetic field generated by the radio frequency, they produce a magnetic field response that induces electrical signals in the electrical conductors of the probe. This signal is picked up by image producing circuitry and is used to generate an image of the sample.

Through the application of specially modulated RF pulses and specifically modulated magnetic field gradients, the induced electrical signals produced by the magnetic field responses of the group of excited protons are indicative of the physical locations and chemical natures of the sample material under investigation. The presentation of the dam as pixels (locations) of given brightness (signal intensities) provide an image of features within the sample. Similar imaging is also possible by using the responses of the unpaired magnetic moments (spins) of electrons of atoms to the radio frequency magnetic field produced by the radio frequency signal. This imaging is known as Electron Paramagnetic Resonance Imaging.

A commonly used probe type for Nuclear Magnetic Resonance imaging usually comprises one or more electrical conductors mounted about a sample cavity within a cylindrical body so the conductors enclose the cavity. The conductors are located in an ordered fashion in the vicinity of the sample cavity. Because a number of conductors are adjacent to each other, they possess an electrical mutual inductance that affects the electrical characteristics of the probe. For example, the mutual inductance of the conductors affects the impedance of the probe and the corresponding resonant frequency of the probe as a result. The resonant frequency of the probe is that frequency at which the capacitive and inductive attributes of the probe cancel one another. Capacitive tuning circuits may be used to tune the probe to a particular resonant frequency for the inherent inductance of the particular arrangement of conductors.

The typical nuclear magnetic resonance probe suffers from a number of limitations. For one, they are only effective at the resonant frequency or a few resonant frequencies for which the probe can be tuned. Second, the sample within or proximate to the sample cavity may also affect the electrical characteristics of the probe and alter the resonant frequency and/or the quality of the induced signals in the conductors of the probe. To return the probe to the selected resonant frequency, the probe must be returned to the resonant frequency with the sample in the sample cavity. Another limitation of these imaging probes is the requirement that the sample fit within the sample cavity.

Other probes that are used in Nuclear Magnetic Resonance Imaging (MRI) are used at local surfaces. These localized surface coils include individual loops or coils of wire placed adjacent the material being imaged. These probes also require tuning to a particular resonant frequency through manipulation of their capacitive and inductive attributes to generate an effective image. A review of localized surface probe geometries is provided in "Dedicated Coils In Magnetic Resonance Imaging", Sobol, W. T., *Revs. Magn, Reson. Med.*, 1987. Limitations associated with these coils include their use as a receiver only or transmitter only probe. If they are used as receiver only coils, they must be decoupled from the transmitter or excitation coil to avoid artifacts in the image. Additional problems with these probes include the degradation of the signal-to-noise ratio (S/N) in the receiver caused by the fringe electric fields about the wires.

Another type of probe developed for NMR imaging is a catheter probe for imaging the walls of arteries and the like. Such a probe includes a dielectric material such as Teflon ® about which electrical conductors are coiled. The electrical conductors are covered with a shrink sleeve to prevent contact of the vascular tissue in the artery with the electrical conductors. Because the electrical conductors are typically mounted about a cylindrical dielectric, they can be placed within an artery and maneuvered proximate a location of interest such as an arterial blockage. Once in place, a static magnetic field is produced to align the protons of the nuclei of the surrounding tissue and a radio or microwave frequency pulse is transmitted through the electrical conductors to produce the nuclear magnetic field response. In this manner, tissue surrounding a catheter probe can be imaged.

The catheter probe discussed above has a number of problems. For one, the inductance of the ,electrical conductors of the probe require a capacitive tuning circuit so the probe may be tuned to a resonant frequency. Moreover, the composition of the tissue surrounding the electrical conductors also affects the electrical characteristics of the probe and the tuning circuit may require adjustment for effective imaging. Finally, the field of view of the catheter probe is a function of the size of the coiled portion of the electrical conductors, and, for a given resonance frequency, the range of the capacitance needed to tune the probe can change with the length of the resonant portion.

What is needed is an imaging probe that can be used for Nuclear Magnetic Resonance Imaging and Electron Paramagnetic Resonance Imaging which is not limited to a resonant frequency and which has an adjustable field of view and an adjustable depth of view.

SUMMARY OF THE INVENTION

The above identified problems are alleviated by a short circuited or truncated probe for Nuclear Magnetic or Electron Paramagnetic Resonance Imaging built in accordance with the principles of the present invention. More particularly, the truncated imaging probe includes an outer, hollow conductor having first and second ends, a central conductor being mounted within the outer conductor, the central conductor being electrically coupled to the outer conductor at the second end of said outer conductor, and an opening in the outer conductor proximate the second end of the outer conductor so that a magnetic field is emitted from the central conductor near the second end in response to the transmission of one of a microwave and radio frequency pulse along the central conductor to the second end of the outer conductor, the emitted magnetic field being spatially limited by the opening to induce a magnetic field response from materials surrounding the opening in the outer conductor, the magnetic field response of the material being transmitted out of the truncated probe for imaging of the materials surrounding the opening.

One embodiment of a truncated imaging probe built in accordance with the principles of the present invention is a large imaging probe capable of imaging the cross section of a major limb such as an arm or leg. The large truncated imaging probe includes an outer conductor having a cylindrical portion and a conical portion with the conical portion tapering to a connector used to couple a radio frequency source and imaging circuitry to the imaging probe. Mounted within the outer conductor is a central conductor which is coupled at one end to a conductor extending from the connector. The central conductor and outer conductor are electrically isolated from one another at the connector. The second end of the central conductor is electrically coupled to the outer conductor to electrically short circuit the central conductor to the outer conductor. An opening is formed in a portion of the outer conductor in the vicinity of the second end to expose the central conductor. Preferably, the opening is large enough so that the remaining portion of the cylindrical wall lies below an uppermost surface of the central conductor. This construction permits the central conductor to emit a magnetic field in the vicinity of the second end of the central conductor in response to a radio or microwave frequency pulse that travels down a transmission line composed of the central conductor and the outer conductor. The emitted field is shaped in the direction parallel to the central conductor by the opening in the cylindrical wall. That shape is irradiated in the sample placed near the opening. The central conductor receives the magnetic field response of the irradiated portion of the sample and transmits this response by its transmission line properties to the connector and hence to the imaging circuitry.

Several advantages over previously known imaging probes are possible with the above described probe. For one, the above identified probe need not operated at a resonant frequency and, accordingly, tuning circuitry is not required for effective imaging. As consequence, the probe may be used over a wide range of frequencies without requiring tuning adjustments prior to use of the probe. A second advantage of the large truncated probe is the ability to shape the field of view to be imaged by altering the shape of the opening in the outer conductor. Thus, the opening may be reduced to expose only a small portion of the sample or increased to image a larger region or larger sample. A third feature of the large truncated probe is its capability to image a sample located outside of the probe. Further, the magnetic field emitted from the central conductor has a field strength that is inversely related to the distance from the axis of the central conductor. Thus, a large probe with a large central conductor may be used to increase the depth of imaging for larger objects. With respect to the field of view formed by the opening, the large truncated probe may be fitted with a movable, conductive sleeve that may be shifted to selectively size the opening in the outer conductor.

Further modifications to the large truncated probe are possible. For instance, the central conductor may have a substantially horizontal conductive plate or saddle attached to its upper surface to provide a stable platform on which a limb or the like may be supported for imaging. The conductive saddle also shapes the emitted magnetic field to make it more homogeneous across the plane of the saddle. Additionally, a nonconductive dielectric material may be inserted within the central conductor to provide rigidity to the central conductor so that it may support the sample to be viewed. Likewise, a nonconductive dielectric sleeve may be mounted about the outer conductor to further provide rigidity to the truncated imaging probe. The nonconductive sleeve is formed with an opening that conforms to the opening in the cylindrical wall of the outer conductor. Moreover, a nonconductive sheet is placed on the surface of the saddle to prevent electrical contact with the sample.

Another embodiment of the truncated probe is a planar, truncated probe that incorporates the elements of the large truncated probe in a novel configuration that compresses the height of the probe. The planar probe relates to magnetic resonance but may also be used in electron paramagnetic resonance and other methods that involve magnetization transfer between species with different gyromagnetic ratios such as proton-electron double resonance. The preferred use of the planar probe is as a localized probe for medical imaging.

The probe includes a first and second conductive member, each of the conductive members having first and second ends. The first ends of the conductive members are adapted to couple to a RF frequency pulse source and the second ends of the conductive members are electrically coupled together to form an electrical circuit. The first and second ends of the conductive members are generally parallel to one another. The first end of the first conductive member is coupled to the central conductor of an electrical connector and the first end of the second conductor is coupled to the outer shield of the electrical connector. By coupling an RF frequency generator to the electrical connector, a RF frequency pulse may be transmitted through the electrical circuit formed by the first and second conductive member to emit a magnetic field towards a sample proximate the probe. The relaxation response of the sample is received by the, probe and coupled to imaging circuitry. The second conductive member preferably has dimensions which are greater in length and width than the length and width of the first conductor so the first conductor may be placed within the length and width of the second conductor. Thus, one side of the first conductor is essentially covered by the second conductor while the other side of the first conductor is completely exposed to the sample to be imaged.

The structure of the novel truncated planar probe shields the electric field of the standing wave created by radio or microwave frequency power and provides more precise control of the shape and homogeneity of the radio frequency magnetic field within the imaged volume of the sample. The electric field shielding improves the S/N ratio of the probe by allowing a narrower bandpass adjacent to tissue.

Another embodiment of a truncated imaging probe built in accordance with the principles of the present invention is a catheter probe which may be used for imaging corpuscular tissue. The catheter probe includes a central conductor—such as that within a coaxial cable—that is surrounded by an electrical shield comprised of stranded electrically conductive wires. The central conductor is electrically short circuited to the electrical shield at the second end of the catheter probe, and at the first end a connector is mounted so the electrical shield is electric, ally isolated from the central conductor. In the vicinity of the short circuit of the electrical shield to the central conductor, the electrical shielding is removed in full over a portion of the surface or in part over the whole circumference to expose the central conductor. The opening formed by the removal of the shielding shapes the magnetic field emitted from the conductors when a radio frequency or microwave frequency pulse is transmitted through the probe. To prevent the central conductor and electrical shield from being shorted together by bodily fluids or the like at a position other than the second end, the catheter probe is encased in an electrically insulating jacket from the second end of the probe to the connector. The catheter probe is capable of being placed within the vascular system of a person and moved to a location where the probe may be used to image an arterial wall or the like.

One advantage of the catheter proves its ability to operate over a wide range of frequencies because the catheter probe does not require a tuning circuit. Further, the imaging capabilities of the catheter probe are little affected by the electrical loading properties of the material to be imaged by the probe. Furthermore, the electrical integrity of the probe is maintained as long as there are enough strands of the electrical shield to electrically connect the central conductor to the electrical shield. Since so few strands are required to make this electrical connection, a substantially unhindered 360° field of view about the axis of the catheter probe is possible. Of course, were other field of view configurations desired, the electrical shielding could be removed in a manner to form the appropriate shape for the field of view.

These and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with the general description given above, and the detailed description given below, serve to explain the principles of the invention.

FIG. 1 is a top view of the large truncated imaging probe built in accordance with the principles of the present invention;

FIG. 2 is a cross section of view taken along lines 2—2 of FIG. 1;

FIG. 3 is a cross sectional view of the probe taken along lines 3—3 of FIG. 1;

FIG. 4 is an axial ,cross sectional view of an alternative embodiment of the large truncated probe showing one outer conductor in hidden lines;

FIG. 5 is a cross sectional view taken along lines 5—5 of FIG. 4;

FIG. 6 is a longitudinal cross sectional view of a catheter probe built in accordance with the principles of the present invention.

FIG. 7 is a top view of the planar, truncated imaging probe built in accordance with the principles of the present invention.

FIG. 8 is a cross-sectional view of the probe of FIG. 7 taken along lines 8—8.

FIG. 9 is a cross-sectional view of the probe of FIG. 7 taken along lines 9—9;

FIG. 13 is a diagrammatic view of an inductive coupling scheme for the planar, truncated imaging probe.

DETAILED DESCRIPTION OF THE INVENTION

Figure 10:
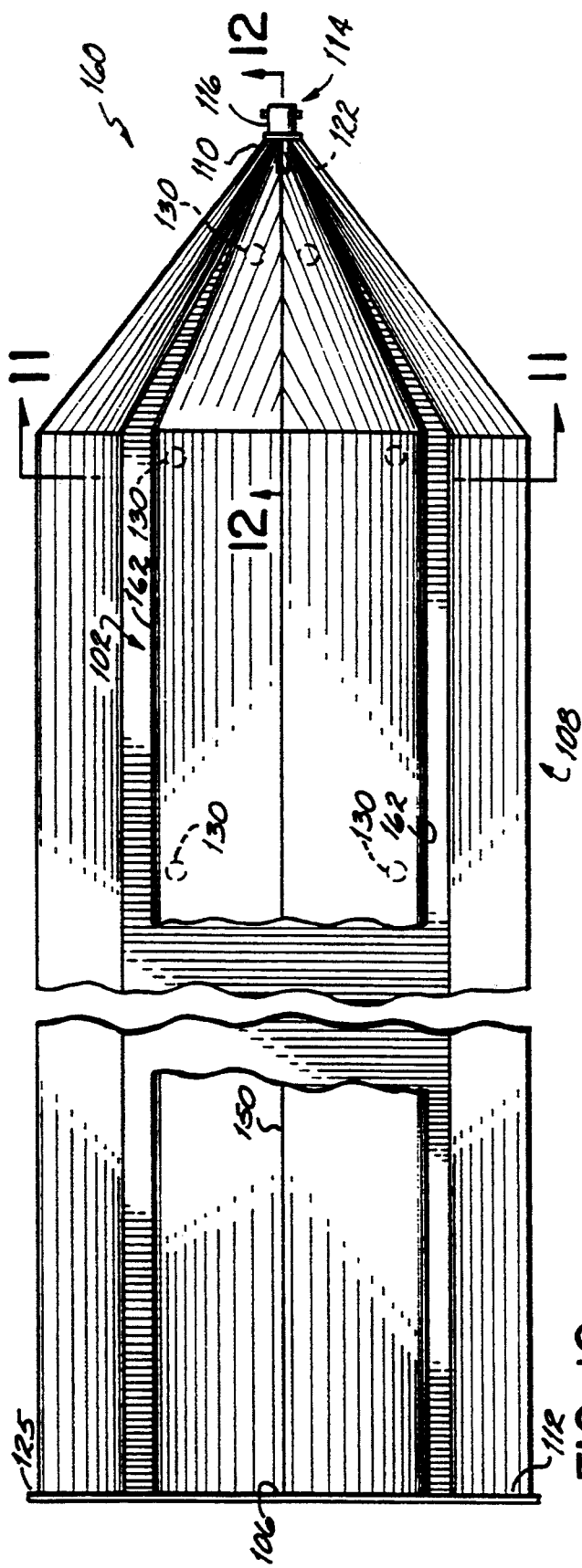
FIG. 10 is a top view of a preferred embodiment of the planar, truncated imaging probe.

FIG. 1 shows a preferred embodiment of the large truncated imaging probe built in accordance with the principles of the present invention. The probe 10 includes an outer conductor 12 having an electrical connector 14 coupled at one end. Mounted within outer conductor 12 is a central conductor 16 that is electrically coupled to the outer conductor 12 by a electrically conductive plug 18 at the end of outer conductor 12 which is opposed to connector 14. A portion of outer conductor 12 is removed to form opening 20 which exposes central conductor 16. A support sleeve 22 is mounted about outer conductor 12 to provide rigidity to the probe 10 in the area surrounding opening 20. Preferably, the inside surface of sleeve 22 adjacent outer conductor 12 is covered in a layer of electrically conductive material 23 for reasons discussed below. Mounted to central conductor 16 is a saddle 24. Saddle 24 is made of electrically conductive material and provides a horizontal support surface for the material to be imaged by the probe 10. Central conductor 16 is electrically connected to the conductor 26 extending from connector 14 so an electrical path is provided from conductor 26 through central conductor 16 to plug 18 and outer conductor 12 back to the shell of connector 14. Thus, the inner and outer conductors of the truncated imaging probe 10 are electrically short circuited to one another by plug 18.

The outer conductor 12 is preferably cylindrical or symmetrical in cross section, although other irregular shapes are possible, in the vicinity of the opening 20 and tapers as a cone at its other end to facilitate its connection to the connector 14. Preferably, the cylindrical portion of the outer conductor is approximately 12" in length and the conical portion is approximately 12" in length. Preferably, the outer and inner conductors are made from brass, copper, silver, or gold, although other electrically conductive materials may be used.

A cross sectional view of the probe 10 in the vicinity of the short circuited end of the probe 10 is shown in FIG. 2. Outer conductor 12 is shown with its upper potion removed to form the opening 20. Surrounding the outer conductor 12 is the sleeve 22 having an opening formed in it to conform to the opening 20. Preferably the opening 20 terminates the outer conductor 12 to a position that lies below conductive saddle 24. In this manner, saddle 24 is exposed. Saddle 24 is covered by a sheet of electrically insulating material 25. Saddle 24 is attached to inner conductor 16 by U-shaped side walls 28 and tapering front and rear walls 29 which act as conductive members. The walls 28, 29 of saddle 24 are preferably made a length and width which is equal to or less than those of the opening 20. Although the preferred opening 20 takes an elliptical shape because of the geometry of conductor 12, other shapes are possible. The walls 28, 29 of saddle 24 are electrically coupled to central conductor 16 by solder or any other method which provides a conductive path from the saddle 24 to central conductor 16.

Removably mounted within central conductor 16 is a nonconductive dielectric material which forms a support 30. Both the support 30 and the sleeve 22 are preferably made from PVC (polyvinyl chloride), although other nonconductive materials may be used. The PVC tubing which forms support 30 may be removed through an opening 32 (FIG. 3) cut in plug 18. Plug 18 is made of an electrically conductive material and washer shaped having internal and external flanges which may be frictionally fit in the end of outer conductor 12 and around conductor 16 to electrically connect outer conductor 12 to central conductor 16. Alternatively, plug 18 may take the shape of a flat washer and be electrically connected between outer conductor 12 and central conductor 16 by solder or other electrically conductive material. Alternatively, the opening 20 of the outer conductor may be varied by rotating or longitudinally moving sleeve 22 so the conductive layer 23 alters the shape and size of the opening 20.

Preferably, the ratio of the outside diameter of the inner conductor and the inner diameter of the outer conductor is 2.30. Such a ratio for conductors separated by an air dielectric yields a coaxial conductor having an impedance of approximately 50 ohms, as is well known within the art. In the embodiment depicted in FIG. 2, the inner diameter of the outer conductor is 4.0".

A longitudinal cross sectional view of the probe 10 is shown in FIG. 3. Plug 18 is shown electrically connecting outer conductor 12 to central conductor 16. An opening 32 is provided in plug 18 to permit the removal of support 30 located within central conductor 16. Plug 18 may be formed from conductive material cut to the shape of a disk that is approximately the same diameter as the opening in outer conductor 12. Plug 18 may be coupled to central conductor 16 by cutting out the opening 32 and cutting the disk back towards its circumferential edge to form radial strips. The ends of these radial strips at opening 32 may be bent over the outboard end of conductor 16 when the disk is placed within the opening of outer conductor 12 to ensure the electrical coupling between the plug 16 and the central conductor 16. To further insure electrical connection between outer conductor 12 and central conductor 16 through plug 18, solder may be applied to the fit between the circumferential edge of plug 16 and outer conductor 12 as well as the ends of the radial strips coupled to the central conductor 16. Side walls 28 of saddle 24 are shown coupled to central conductor 16 at approximately the upper third of the central conductor, although coupling to the central conductor 16 is not limited to this location. While saddle 24 is shown to be formed as an integral unit it may be fabricated from several pieces and electrically connected together and electrically connected to central conductor 16. Protective sleeve 22 may also be removable from the probe 10 to expose the outer walls of outer conductor 12.

An alternative embodiment of the truncated imaging probe is shown in FIG. 4. The alternative, embodiment 40 includes an outer conductor 42 having most of the cylindrical wall of outer conductor 42 removed so two conductive strips 43, preferably opposite one another, extend to the end of the probe 40. Central conductor 44 extends from a connector (not shown) and terminates proximate the termination of the two strips 43. The strips 43 and central conductor 44 are connected by radial strips hereinafter referred to as a plug 46 which provides an electrical path from central conductor 44 through plug 46 to the strips 43 and hence to outer conductor 42 and the connector (not shown).

A cross sectional view of this truncated probe is shown in FIG. 5. This alternative embodiment demonstrates the ability of the truncated imaging probe of the present invention to provide a field of view for the probe 40 by changing the shape of the opening in the outer conductor 42. In the embodiment depicted in FIG. 4, the probe 40 can image all of a sample located about the probe except where the strips 43 are interposed between the sample and the central conductor 44.

FIG. 6 shows a preferred embodiment of a catheter imaging probe built in accordance with the principles of the present invention. The probe 60 is made from a coaxial cable 62 such as that produced by Huber & Suhner, Inc. of Essex, Vt. which is designated as type S02232 cable. One end of the coaxial cable is adapted to fit to a connector 154, which is preferably a BNC type connector, so the central conductor 66 of the coaxial cable extends from connector 64 outwardly to its end 65. Electrical shield 68 surrounds central conductor 66 up to edge 70. End 72 of shield 68 likewise surrounds central conductor 66. The normal shielding of the cable 62 is approximately 98% removed from edge 70 of the electrical shield 68 to its end 72, although other percentages of shield removal are possible so long as the shield is electrically "leaky". The leaky characteristics of the shielding 68 lessen the separation of the RF field between the truncated line 60 and the surroundings. The end 72 of the electrical shield 68 is electrically connected to the central conductor 66 by a conductive plug 78. Conductive plug 78 may be solder or other electrically conductive material which securely and electrically couples the electrical shield 68 to the central conductor 66. Thus, an electrical path is provided from connector 64 through central conductor 66, conductive plug 78, and electrical shield 68 back to the shell of connector 64. Probe 60 is encased within an insulating sleeve 80 preferably a shrink tube to prevent the electrical short circuiting of central conductor 66 to electrical shield 68 at any point other than conductive plug 78. In the preferred embodiment of the catheter probe 60, the imaging area of the probe is approximately 4 inches long with a diameter of approximately 0.08" (2 mm), although other dimensions could be used to form catheter probes for various uses. Preferably, the coaxial cable is selected so that with the dielectric surrounding the central conductor the impedance of the cable is approximately 50 ohms. The catheter probe 60 of the above referenced dimensions is capable of being inserted within the corpuscular system of a person.

Generally, the probes 10, 40, and 60 disclosed above operate by placing the probe in the vicinity of the material to be viewed. The material to be imaged by the probe is subjected to a strong static magnetic field typically having a field strength of approximately 1.5 Tesla when the RF frequency is 64 MHz for viewing 1-

Nuclear Magnetic Resonance images. The electrical connectors of the respective probes are coupled to an electrical source and image circuitry by an electrical cable or the like. The electrical source provides the excitation energy as a pulse of radio or microwave frequency, which typically is in the range of a few kilohertz to approximately 30 gigahertz. The pulse travels from the connector through the transmission line comprised of the central conductors 16, 44, and 66 and the outer conductors 12, 42, and 68 of the respective probes and is reflected at the electrically conductive plugs 18, 46, and 78 back to the connector. The electrical pulse creates a standing wave in the probe. The absolute value of the virtual current generated by the standing wave is a maximum at the short circuited end of the truncated imaging probe and is approximately zero at the quarter wavelength distance of the pulse frequency. The virtual current maximum at the short circuited end of the probe generates a magnetic field that excites the protons of the nuclei in the sample exposed to the central conductor through the openings in the respective probes. After the electrical energy of the pulse and the corresponding magnetic field dissipates, the excited protons in the nuclei of the sample relax or return to the energy state in which they were placed by the static magnetic field. Until the nuclear relaxation is complete, the coherent magnetic RF field of the protons generates an electromagnetic signal in the central conductor, which is transmitted to the imaging circuitry coupled to the imaging probe. Thus, the imaging probes of the present invention may be used to image a sample which lies outside of the probe.

The field of view of the probe may be changed by altering the opening in the outer electrical conductor since the magnetic field emitted by the central conductor is shaped along the cable axis by the portion of the inner conductor which is exposed through the shield opening. Further, the depth of the field of view is affected by the diameter of the central conductor and the power of the RF excitation pulses. Specifically, the greater the radius of the central conductor and the greater the power of the RF pulse, the greater the depth of the field of view. Alternatively, the shape of the emitted field and correspondingly, the field of view may be altered by changing the shape of the inner conductor. A further advantage of the invention is its ability to produce signals useful for imaging from electrical pulses having a wide range of frequencies without the need for tuning circuitry since the probe need not operate at a resonant frequency to effectively irradiate a sample and receive the response of the sample.

Specifically, the embodiment shown in FIG. 1 is used by connecting the image circuitry and electrical pulse source through an electrical cable to connector 14. A pulse is transmitted from the source through the electrical cable to the conductor 26 extending from the connector 14 to the central conductor 16. The pulse travels down the transmission line, reflects at the plug 18, and passes back to the connector 14. The material placed on saddle 24 is irradiated by the magnetic field produced in the vicinity of the short circuited end of the probe 10 and the relaxation response of the protons is received by the central conductor 16 and returned to the imaging circuitry coupled to the connector 14. Additional data may be collected from the probe by altering the frequency of the electrical pulse source without requiring any returning of the image probe. Preferably, the static magnetic field used to align the magnetic moments of the nuclei in the sample is oriented in the same direction as the longitudinal orientation of the central conductor so the magnetic field emitted from the central conductor is perpendicular to the static magnetic field. The probe 10 shown in FIG. 1 may also be used for electron paramagnetic resonance imaging as well.

The alternative embodiment of FIG. 4 is used in much the same way as the preferred embodiment shown in FIG. 1. The most notable difference between the two probes is the capability of the probe in FIG. 4 to image the sample surrounding the opening except for the sample portion blocked from central conductor 44 by the strips 43.

Use of the catheter probe shown in FIG. 6 may be used by aligning a person's body with a static magnetic field so that the north-south direction of the static magnetic field is aligned with the arterial vessel to be imaged. The catheter probe 60 may be inserted into the arterial vessel of a person and navigated through the arterial system to a point of interest such as a blockage or the like. A radio frequency or microwave frequency pulse may then be transmitted down the central conductor of the probe 60 to generate a magnetic field in the vicinity of the short circuited end of the probe. The relaxation response of the arterial walls of the vessel is transmitted by the central conductor back to the imaging circuitry coupled through the connector 64. Probe 60 provides a substantially continuous 360° view of the arterial wall. Further, the electrical shielding may be removed for up to approximately nine centimeters from the end of the probe to generate imaging data for a corresponding length of the arterial wall.

A top view of a planar, truncated imaging probe 100 which has a large exposed surface area is shown in FIG. 7. A first conductive member 102 has a first end 104 and a second end 106. A second conductive member 108 has a first end 110 and a second end 112. The length and width of conductive member 108 are greater than the length and width of conductive member 102 so the entire underside of conductive member 102 is covered by conductive member 108. Proximate the first ends of the conductive members, 102 and 108, is a connector 114 for coupling an RF frequency generator to the probe 100. The connector 114 preferably includes a BNC connector having its connector shell 116 electrically coupled to the first end 110 of second conductive member 108 and the central conductor 122 of connector 114 is electrically coupled to the first end 104 of first conductive member 102. Alternatively, the first end 110 of conductive member 108 may be electrically coupled to a hollow conductive tube 118 while central conductor 122 of connector 114 is electrically coupled to first conductive member 102 through a conductor 123 mounted within tube 118. Conductive member 108 may be electrically coupled to electrical ground within the RF frequency generator through shell 116 of connector 114 to form an electrical circuit. A conductive shield 120 is provided over the junction of conductor 123 and first member 102 to protect the junction. Thus, conductive member 102 may be electrically coupled to the output of a RF frequency pulse generator.

The second end 106 of the first conductive member 102 is electrically coupled to the second end 112 of the second conductive member 108 to complete an electrical path through conductive members 102, 108. In the probe shown in FIG. 7, this electrical coupling of the first and second conductive members is preferably achieved by forming a single sheet of metal to comprise all three conductive members, 102, 108, 125. Alternatively, two separate conductors may be coupled together by soldering a third conductive member 125 to the second ends of the first and second conductive members, or by connecting the ends 106, 112 directly to one another. Preferably, conductive members 102, 108 are made from annealed copper sheet designated under the specification number 110 that complies with ASTM B152 specification. Most preferably, conductive members 102, 108 (and 125 if the alternative embodiment is used) are plated with gold or silver to improve conductivity. The gold plating further renders the conductive members more resistive to corrosion.

FIG. 8 shows the cross-section of the probe 100 of FIG. 7 where the first and second conductive members 102, 108 are coupled to the electrical connector 114. As shown in FIGS. 7 and 8, an electrical isolation pad 128 is placed between conductive member 102 and electrical shield 120. Additionally, non-conductive stand-offs 130 add rigidity to conductive member 102 while preserving the electrical isolation of member 102 from member 108 along their length except at ends 106, 112. The impedance of the probe is determined by the spatial separation of the first and second conductive members. The spatial separation is measured between the lower edge of conductive member 102 and the planar portion of conductive member 108. This distance may be altered and the impedance measured with a time domain reflectometer to determine the distance at which the impedance of the probe matches the impedance at the connector or any other local impedance desired.

FIGS. 7 and 8 also, show that conductive member 108 is comprised of a flat planar area 136 and two upwardly sloping members 138 that slant towards each other at end 110 of conductive member 108 to contact conductive tube 118. Preferably, the members 138 slope upwardly at an angle 154 degrees from planar area 136. Likewise, conductive member 102 is comprised of two sloping members 144 that are joined at apex 150. Preferably, the members 144 are at an angle of 131 degrees from one another. Apex 150 of the first conductive member 102 may be higher, lower, or level with the top edge of the sloping members 138 of the outer conductor 108. Additionally, the lower edges of members 144 proximate second member 108 are preferably curved or rounded to reduce fringing fields that degrade the homogeneity of the RF magnetic field.

FIG. 9 shows an axial cross-sectional view of the probe proximate ends 104, 110. This view shows that apex 150 of conductive member 102 descends to the central conductor 123 within the tube 118. In this embodiment, shield 120 extends the ground shield provided by conductive tube 118 beyond the junction of conductor 123 and conductive member 102. Alternatively, shield 120 and pad 128 may be excluded without degrading the performance of the probe.

Figure 11:
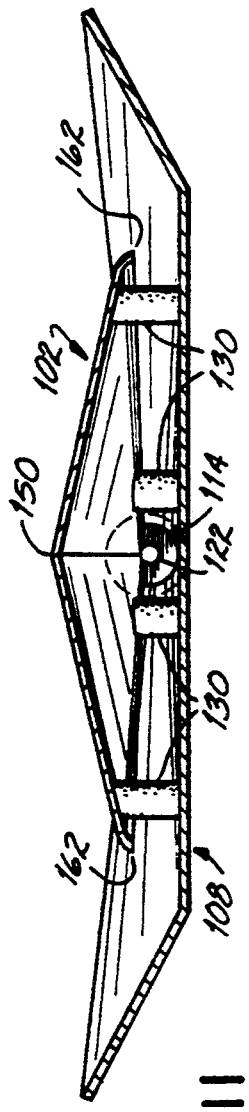
FIG. 11 is a cross-section view of the probe of FIG. 10 taken along lines 11—11.
Figure 12:
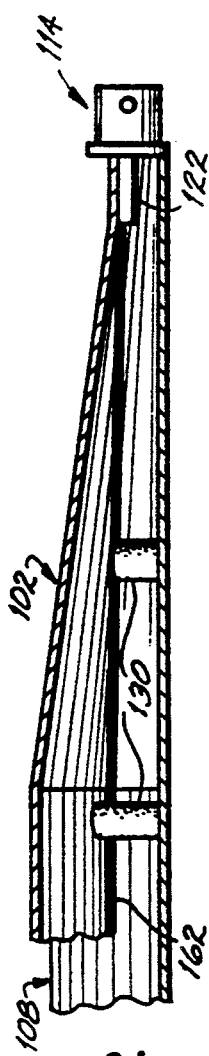
FIG. 12 is a cross-sectional view of the probe of FIG. 10 taken along lines 12—12.

A preferred embodiment of the planar, truncated imaging probe is depicted in FIG. 10. The probe 160 is constructed as the probe shown in FIG. 7 except the first conductive member 102 couples directly to the central conductor 122 of the connector 114. Likewise, the shell 116 of connector 114 is coupled directly to the second conductive member 108. This structure substantially reduces the electrical impedance discontinuity between the connector 114 and the probe 160. A cross-sectional view of the coupling between the connector 114 and conductor 122 is shown in FIGS. 11 and 12.

The preferred embodiment of the planar truncated imaging probe 160 also includes a preferred curvature in the first conductive member 102 along its lower edge 162. This curvature helps reduce fringing fields that degrade the homogeneity of the RF magnetic field.

Alternatively, a probe 170 built in accordance with the principles of the present invention may be inductively coupled to the RF frequency generator as diagrammatically shown in FIG. 13. As shown there, a loop of electrically insulated wire 172 is located below the apex 150 of conductive member 102 and above the longitudinal mid-line of conductive member 108. The first end 174 of loop 172 is electrically coupled to a tunable capacitor 176 which is in turn coupled to the central conductor 122 of connector 114. The second end 178 of loop 172 is electrically coupled to connector shell 116. Also, the first ends of conductive members 102, 108 are coupled together with a tunable capacitor. The capacitors are tuned to make the probe resonant.

In operation, a radio frequency pulse from the output of a radio frequency generator coupled to connector 114 is transmitted through conductive members 102, 108 to generate a magnetic field that radiates a sample placed proximate the probe 160. This magnetic field causes a relaxation response that is received by the electrical circuit formed by conductive members 102, 108 and transmitted to imaging circuitry coupled to connector 114. Techniques, well known in the art, may be used to couple tuning circuits to the probe 160 at the connector 114. These tuning circuits are used to tune the electrical circuit formed by the first and second members to a remnant frequency and to match the RF transmission line's impedance to the probe.

While the present invention has been illustrated by the description of alternative embodiments, and while the embodiments have been described in considerable detail, it is not the intention of the applicant to restrict or in anyway limit the scope of the appended claims to such detail. Additional advantages and modifications will readily appear to those skilled in the art. For example, the probes described above could be used to generate electron paramagnetic resonance images as well. The invention in its broadest aspects is therefore not limited to the specific details, representative apparatus and method and illustrative examples shown and described. Accordingly, departures may be made from such details without departing from the spirit or scope of applicant's general inventive concept.

What is claimed:

1. A planar truncated imaging probe for nuclear magnetic or electron paramagnetic resonance imaging comprising:

a first conductive member having first and second ends, and two sloping sides joined at an apex, said first end of said first conductive member being adapted to electrically couple to an output of an RF frequency generator;

a second conductive member having first and second ends, said first end of said second conductive member being adapted to electrically couple to an electrical ground associated with said RF frequency generator and said second end of said second conductive member being electrically coupled to said second end of said first conductive member to form an electrical circuit, said second conductive member having a length and width greater than a length and width of said first conductive member so that said second conductive member effectively covers said first conductive member along said length and width of one side of said first conductive member while exposing said length and width of one side of said first conductive member along a second side so that a magnetic field is emitted from said electrical circuit in response to a radio frequency pulse being transmitted through said electrical circuit.

2. The probe of claim 1, said second conductive member further comprising:

a fiat planar member with upwardly sloping sides.

3. The probe of claim 1, said probe further comprising:

an electrical shield; and a conductive tube with a conductor mounted therein, said electrical shield being electrically coupled to said conductive tube and said second conductive member and said conductor mounted within said tube being electrically coupled to said first conductive member.

4. The probe of claim 3, said conductor within said conductive tube being electrically coupled to a conductor associated within a connector and said conductive tube being electrically coupled to a shell associated with said connector.

5. The probe of claim 3, said first conductive member sloping downwardly to couple said conductive member with said conductor within said conductive tube.

6. The probe of claim 1, said probe further comprising:

electrical isolation stand-offs interposed between said first and second conductive members, said stand-offs providing rigidity to said first conductive member while preserving the electrical isolation of said first and second conductive members.

7. The probe of claim 1, said sloping sides being approximately 131 degrees apart.

8. The probe of claim 1, said sloping sides being approximately 131 degrees apart.

9. The probe of claim 2, said upwardly sloping sides being at an angle of 154 degrees from said flat planar member.

10. The probe of claim 1, said first and second members being plated with silver.

11. The probe of claim 1, said first and second members being plated with gold.

12. The probe of claim 1, said probe further including:

an inductive loop for electrically coupling said first and second conductive members to said RF frequency generator.

* * * * *